United States Patent
Plettner

(10) Patent No.: US 6,940,455 B2
(45) Date of Patent: Sep. 6, 2005

(54) TRANSPONDER

(76) Inventor: Andreas Plettner, Schornstrasse 4, 81669 München (DE)

( * ) Notice: Subject to any disclaimer, the term of this patent is extended or adjusted under 35 U.S.C. 154(b) by 869 days.

(21) Appl. No.: 09/805,733

(22) Filed: Mar. 13, 2001

(65) Prior Publication Data

US 2001/0053675 A1 Dec. 20, 2001

(30) Foreign Application Priority Data

Mar. 16, 2000 (DE) .......................................... 100 12 967

(51) Int. Cl.$^7$ ................................................. H01Q 1/38
(52) U.S. Cl. ............................... 343/700 MS; 343/795; 340/572.7; 455/91
(58) Field of Search .......................... 343/700 MS, 793, 343/795; 340/572.1, 572.7, 572.8; 455/39, 91

(56) References Cited

U.S. PATENT DOCUMENTS 6,259,408 B1 * 7/2001 Brady et al. ......... 343/700 MS
6,346,922 B1 * 2/2002 Proctor et al. .............. 343/795
6,466,131 B1 * 10/2002 Tuttle et al. ............. 340/572.7
6,518,885 B1 * 2/2003 Brady et al. ............. 340/572.7

FOREIGN PATENT DOCUMENTS

| DE | 196 28 504 | 1/1997 |
| DE | 197 53 619 | 5/1999 |
| DE | 197 28 512 | 7/1999 |
| WO | WO 98 03 938 | 1/1998 |

* cited by examiner

Primary Examiner—Tho Phan
(74) Attorney, Agent, or Firm—Seed IP Law Group PLLC

(57) ABSTRACT

A transponder comprising a chip having contact pads and at least two coupling elements, which are conductively connected with the contact pads, wherein the coupling elements are touch-free relative to each other and formed in a self-supported as well as free-standing way and are essentially extended parallel to the chip plane, the total mounting height of the transponder corresponds essentially to the mounting height of the chip, and the coupling elements are in geometry and size adapted for acting as a dipole antenna or in conjunction with an evaluation unit as a plate capacitor.

20 Claims, 2 Drawing Sheets

TRANSPONDER

The present invention relates to a transponder comprising a chip with coupling elements, according to the preamble part of the claims 1 and 5, and to a method of manufacturing a transponder.

BACKGROUND OF THE INVENTION

In multiple areas the use of RFID systems for the identification of arbitrary objects has increased during the last years. The term RFID stands for radio-frequency-identification and designates an identification by means of radio waves. An RFID system is always comprised of two components: an evaluation unit, which can be formed as read and/or write unit; and a transponder, which carries the data used for the identification.

As a result of simple handling and a robust formation, transponders have an insignificant susceptibility and, therefore, offer a series of interesting possibilities of application. Thus, transponders are already used today in distinctive areas, as e.g. in access control systems, embedded in access tickets, wrist-watches, key tie-on labels or corporate identification cards, in monitoring systems, embedded in paper or plastic labels or also in credit instrument systems, embedded in contactless chip cards.

The at present most fabricated transponders comprise a coupling element on a substrate, which is connected with a small surface chip. The coupling element itself is either formed as conductor loop for a predominantly inductive coupling, or as dipole. In the case that the coupling element is formed as a dipole, the transponder can be used both in a so-called "close-coupling-system" as well as in a "long-range-system".

Close-coupling-systems are RFID systems with very small ranges, in which the dipole of the transponder makes a pure capacitive signal coupling of an evaluation unit possible, said evaluation unit being located in a small distance of about 0.1 cm to 1 cm from the transponder and comprising likewise suitable electrode surfaces. For signal coupling, both dipoles are positioned parallel to each other, and thus, form plate capacitors, over which the data and/or energy are transmitted.

In long-range-systems, ranges of between 1 m to 10 m distance between transponder and evaluation unit may be achieved. In long-range-systems the dipole is formed as dipole antenna and is operated with very high frequencies, which are in Europe currently located at approximately 2.45 GHz, resp. 5.8 GHz. Therein, a power is irradiated over an evaluation unit, said power being provided to the terminals of the dipole antenna of the transponder as a high frequency voltage and used after rectification as supply of the chip.

In the transponders with dipole that are presently in common use, a chip or a chip module is connected over corresponding contacts with the dipole, in order to be able to communicate with the outer world.

According to this state-of-the-art, the electrical contacting of the chip with the dipole is obtained by placing the chip on a substrate, on which the dipole is formed and thereafter connecting the chip with the dipole.

For achieving this electrical connection between dipole and chip, especially the use of chip modules, the so-called "flip-chip"-method as well as the wire bonding method are generally adopted and will be described in detail in the following.

FIG. 2 explains the principle, of how according to the state-of-the-art an electrical connection between a chip module 1 and a dipole 4 is commonly produced.

A chip module 1 that includes in it's interior a not-shown chip, has contacts 2, which are accessible from the exterior and which are, for instance, connected with the actual contacts of the chip by means of a soldering process, an adhesive process or a wire bonding process. By reference sign 3, contact terminals are designated, which are directly connected with the dipole 4 that is placed on a substrate 6. To finally achieve a contacting between the dipole 4 on the one side and the chip on the other side, the contacts 2 must be conductively connected with the contact terminals 3. Thereto, the module 1 is placed by means of a tool with its side comprising the contacts on the contact terminals 3.

Another possibility is to place in a flip-chip process the chip 5 itself, that means not in the form of a module, but "naked" on the contact terminals 3, as illustrated in FIG. 2a. According to this possibility, the chip 5 must be placed with its "active side", that means the side that carries the contact pads 7 on the contact terminals 3. Thereto, the chip must be "flipped", thus requiring a double gripping of the chip 5, e.g. from a carrier tape.

FIG. 3 illustrates the possibility, of how according to the state-of-the-art an electrical connection between a chip 5 and a dipole 4 can be produced by means of a wire bonding process.

To achieve in this case a contacting between the dipole 4 on the one side and the chip 5 on the other side, the chip is placed on the substrate 6 and the contact pads 7 are conductively connected with the contact terminals 3 by means of wire bonding. As can be seen, according to this solution the chip 5 must no more be flipped. However, the wire junctions generated by the wire bonding lead to an increased total mounting height of the transponder and must moreover be protected by a solid protective coating.

SUMMARY OF THE INVENTION

Starting from the known state-of-the-art, it is the object of the present invention, to simplify the manufacturing of transponders in which the coupling element is formed as a dipole, wherein the contacts between a chip and the dipole provide for a high electrical and mechanical reliability.

This object is solved by the subject-matters of claims 1, 5 and 7.

Preferred embodiments of the invention are the subject-matter of the dependent claims.

In particular, the object of the present invention is solved by a transponder comprising a chip with coupling elements, wherein the coupling elements themselves are formed as dipole and are not formed on a substrate and wherein the coupling elements are directly conductively connected with the contact pads of the chip. Thereby, the corresponding transponder can be used in a long-range-system if the coupling elements are formed as a dipole antenna and if the coupling elements are formed such, that they act in conjunction with an evaluation unit as a plate capacitor, the transponder can be used in a close-coupling-system.

According to a particular aspect of the present invention, transponders are provided having coupling elements that are directly connected with the contact pads of the chip, wherein the coupling elements are touch-free relative to each other and formed in a self-supported as well as free-standing way and are essentially extended parallel to the chip plane. Furthermore, the coupling elements are in geometry and size formed in a way to enable a signal coupling of an evaluation unit, which can be performed either by means of high frequencies or purely capacitive. In particular, the total mounting height of the transponder corresponds essentially to the mounting height of the chip owing to the flatly projecting coupling elements.

According to a further preferred embodiment of the present invention, the coupling elements are connected with the contact pads of the chips immediately at the wafer level, i.e. before the chips are extracted from the grouping given by the wafer. Thus, the coupling elements can project in vertical direction from the respective contact pads so that they are formed such, that they have for instance an undulatory form or wave form beginning at the respective chip in a horizontal direction. The coupling elements, therefore, are essentially not lying in the same plane as the chip. The essential advantage of this embodiment is that the effective surface of the coupling elements may thereby be increased in a simple manner. In particular, the coupling elements can also be formed in a meandrous way. It should be noted that after the dismembering of the manufactured transponders, the coupling elements of the generated transponders no longer project vertically from the corresponding chip, but instead flat, as has been described above, as the wave form only appears due to an attaching of the coupling elements at the wafer level.

Therefore, the above described flipping by means of a flip-chip process as usual in the state-of-the-art can be avoided. The generation of a dipole structure on a substrate is also dropped, as the coupling elements resp. the dipole are preferably connected with the contact pads of the chips directly at the wafer level, whereby the process durations are substantially decreased. Furthermore, a contacting of the chip placed on such a substrate by means of wire bonding is no longer necessary, so that a used substrate thereafter fulfills only a carrier and/or protection function regarding the transponder. In particular, the inventive transponder is very robust, as the coupling elements have a high tensile strength and resist to a high tensile loading owing to their dimensions and the contact pads, which are preferably formed in a corresponding size. Additionally, the coupling elements provide for a high electrical reliability.

In the case that a transponder should be positioned on a carrier substrate, it may be desirable to fix the chip on the substrate. In order to avoid gluing the chip itself on the substrate, whereby the process duration would be decreased due to an elimination of the rest time when gluing, the coupling elements can be connected with the substrate on their outer ends. The chip is consequently not connected with the substrate, thus causing an efficient strain relief of the chip, as the substrate may be stretched or flexed without stressing the chip itself. In the case that the chip should be protected with a coating mass, a strain relief can be achieved in that the coating mass is more easily stretchable than the substrate. Furthermore, the protection of the chip can also be achieved by a cover film, which is laminated over the chip and the substrate, whereby a gluing or adhesive connection of the cover film with the chip or the coupling elements must be avoided to maintain the above described strain relief.

In the case that a connecting of the chip with a substrate, e.g. by means of gluing, is desirable, the above described strain relief of the chip can be obtained by selecting the used connecting glue between chip and substrate such, that it is more stretchable resp. softer than the substrate. Furthermore, the substrate itself may be more stretchable in the vicinity of the chip to cause thereby the strain relief of the chip.

According to a further preferred embodiment of the present invention, transponders are produced at the wafer level. Besides the above described advantages, this method provides, in particular, the advantage that an efficient production of transponders is already performed at the wafer level and, consequently, a laborious single contacting of each individual chip is no longer required. Therefore, entire rows of chips on a wafer may be connected quasi simultaneously and in the case that the single rows of the wafer have previously been brought in a correct distance with respect to each other, even a quasi simultaneous contacting of all contact pads of the chips with a film laid over the chips of the wafer may be achieved. During the production of the transponders, the chips remain in a grouping with respect to each other, that essentially corresponds to the grouping given by the wafer manufacturing, whereby an extension of the distances between the single chips should self-evidently be obtained by suitable means. The spreading of the single chip rows resp. chip columns can thereby be performed by suitable fine mechanical devices, wherein an adhesive film will preferably be used for saving of the suitable alignment.

As mentioned, the contact pads of the chips may be contacted quasi simultaneously at least concerning rows or columns in the case, that contact films are used, which cover the width of the complete wafer. Alternatively, also films may be used as bands, which are respectively rolled over rows or columns of chips.

Preferred embodiments of the present invention will be explained in the following in more detail with respect to the accompanying drawings. Thereby, the drawings show:

DETAILED DESCRIPTION OF THE PREFERRED EMBODIMENTS

Figure 1:
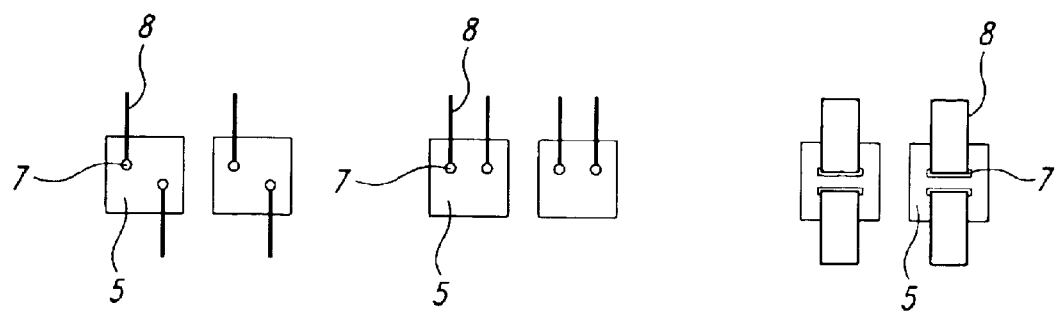
FIG. 1 A top view on different embodiments of transponders according to the present invention.

FIG. 1 shows different top views on transponders, having a chip 5 and coupling elements 8, which are conductively connected with contact pads 7 of the chip 5. The different top views a) to c) are examples of possible embodiments of the inventive transponder, wherein the coupling elements 8 are formed in three different exemplary sizes. It should be noted, that other geometrical forms and sizes are also possible for the coupling elements 8.

In particular, the coupling elements 8 of the shown transponders are themselves formed as dipole and directly conductively connected with the contact pads 7 of the chip 5, so that a forming of coupling elements 8 on a substrate is dropped, whereby the process durations are substantially decreased. Furthermore, a contacting by means of wire bonding of a chip 5 placed on such a substrate is no longer required, so that a used substrate thereafter fulfils only a carrier and/or protection function regarding the transponder. In addition, the flipping by means of a flip-chip process as usual in the state-of-the-art can be avoided. In particular, the inventive transponder is very robust, as the coupling elements 8 resist to high tension loads owing to their dimensions and the contacts pad 7, which are preferably formed in a corresponding size. Additionally, the coupling elements 8 provide for a high electrical reliability.

As can be seen from FIG. 1, the coupling elements 8 do not touch each other, are formed in a self-supported as well as free-standing way and are essentially extended parallel to the chip plane. Hereby, the total mounting height of the transponder corresponds essentially to the mounting height of the chip 5 owing to the flatly projecting coupling elements 8. Furthermore, the coupling elements 8 are in geometry and size formed in a way to enable a signal coupling of an evaluation unit, which can be performed either by way of high frequencies or purely capacitive.

According to a preferred embodiment of the present invention, the coupling elements 8 are formed as a dipole antenna, so that the transponder may be used in a long-range-system. In such a long-range-system the transponder is operated with high frequencies in the GHz range, whereby the frequencies are preferably laying at about 2.45 GHz or 5.8 GHz, whereby the length of the coupling elements 8 is respectively adapted to the used operation frequency, to enable a high frequency coupling.

Figure 1A:
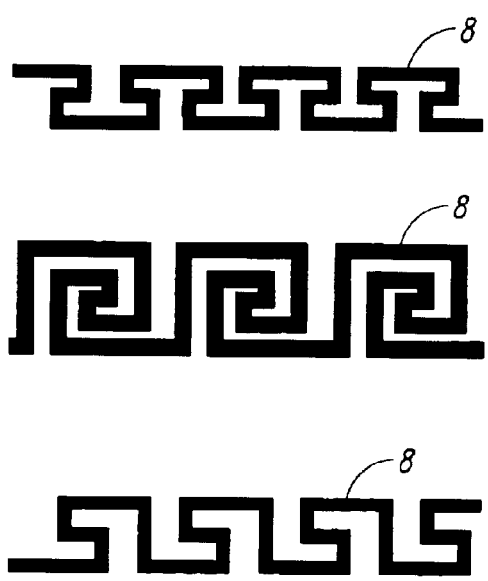
FIG. 1a. Schematic top views of meandrous antenna structures.
Figure 2:
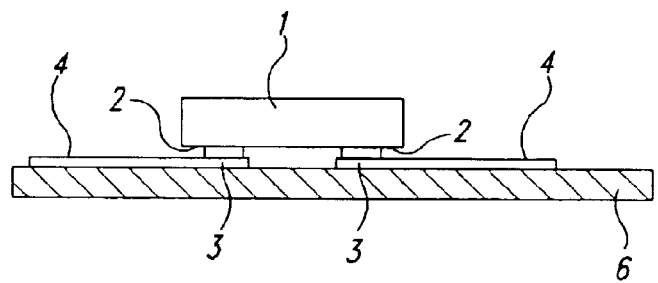
FIGS. 2 and 2a. Schematic illustrations of a module resp. chip contacting according to the state-of-the-art.
Figure 2A:
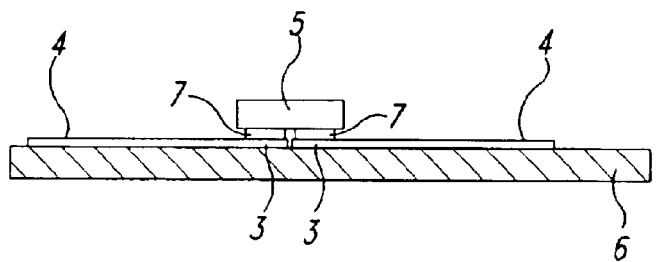
Figure 3:
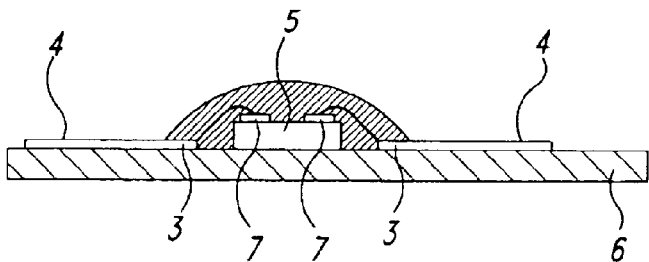
FIG. 3 A schematic illustration of a chip contacting according to the state-of-the-art by means of wire bonding method.

In the case that the coupling elements 8 are formed as a ½ dipole antenna and that the operation frequency is, for instance, 5.8 GHz, the wavelength is about 5.1 cm. Therefore, the dipole antenna must have an effective surface of about 3.4 cm$^2$ by a usual gain of about 1.64. Owing to the antenna length of about 2.5 cm (½), each coupling element 8 must have a width of about 1.3 cm in a rectangular embodiment, for instance. For obtaining such a length of the coupling element 8, it may be formed in a meandrous way, for example, according to one of the structures shown in figure 1a.

One possibility for reducing the coupling element lengths is the use of a corresponding, high operation frequency. Should the coupling elements 8 again be formed as ½ dipole and should the corresponding transponder work at a frequency of 24.125 GHz, which corresponds to a wavelength of approximately 1.2 cm, the effective surface of each of the coupling elements 8 should only have an amount of approximately 0.2 cm$^2$. Consequently, with respect to the above explained form of the coupling elements 8, only a width of about 0.7 cm would be required.

According to a further preferred embodiment of the present invention, the coupling elements 8 are sized such that the conducting surfaces of the coupling elements 8 can act in conjunction with an evaluation unit as capacitor plates and consequently represent a usable coupling capacity for the capacitive coupling of the transponder with the evaluation unit, so that the transponder can be used in a close-coupling-system.

For a pure capacitive coupling, the coupling elements 8 acting as capacitor plates must have a capacity of several pF. In the case that the capacity should e.g. be 3 pF and that the transponder works in a distance of about 1 mm to an evaluation unit, the coupling elements 8 must have a surface of approximately 3.4 cm$^2$ each. Assuming herein that a common size of a chip 5 is 9 mm$^2$, i.e. 3×3 mm, and that the coupling elements 8 are formed rectangularly departing from the width of the chip 5, this would lead to a width of about 11.3 cm. This can render a use of corresponding transponders, for instance, in key tie-on labels or access tickets impossible. Therefore, the coupling elements are preferably formed quadratically with a side length of about 1.8 cm. Furthermore, the coupling elements 8 may also be formed in various other geometrical forms, as e.g. circles or pentagons.

It should be noted that the above given values are dependent on different physical quantities, which can have an influence on the dimensions of the respective dipoles. For instance, if an inventive transponder is embedded in paper, to protect the chip and the coupling elements, the dielectric constant to be considered changes and, consequently, the size of the effective dipole surface.

In particular, an efficient production of transponders can already be performed at the wafer level, so that a laborious single contacting of each individual chip 5 is no more required. Consequently, complete rows of chips on a wafer (not shown) may be contacted quasi simultaneously in the case that bands are used as coupling elements 8, which are respectively rolled over rows or columns of chips 5. In the case that the single rows of the wafer (not shown) have previously been brought in the correct distance to each other, even a quasi simultaneous contacting of all contact pads 7 of the chips 5 with a film (not shown) that is laid over the chips 5 of the wafer (not shown) can be achieved. During the production of the transponders, the chips 5 are maintained in a grouping with respect to each other that essentially corresponds to the grouping given by the wafer manufacturing, whereby an extension of the distances between the single chips 5 should self-evidently be achieved by appropriate means. The spreading of the single chip rows resp. chip columns can thereby be performed by suitable fine mechanical devices, wherein an adhesive film is preferably employed for saving the appropriate alignment.

In particular, the coupling elements can be contacted with the contact pads of the chip directly at the wafer level, i.e. before the chips are extracted from the grouping given by the wafer. Consequently, the coupling elements can project vertically from the respective contact pads so that they are formed such that they have, for instance, an undulatory form or wave form beginning from the respective chip in a horizontal direction. The coupling elements thus lay essentially not in the same plane as the chip. Therefore, the effective surface of the coupling elements may be increased in a simple manner. Furthermore, the coupling elements may be formed in a meandrous way. It should be noted, that the coupling elements no longer project vertically from the corresponding chip after the fragmentation, but instead flat, as has been described above.

What is claimed is:

1. A transponder comprising:
    a chip having contact pads; and
    at least two coupling elements conductively connected with the contact pads wherein:
        the coupling elements are touch-free relative to each other and formed in a self-supported as well as free-standing way and are essentially extended parallel to a plane of the chip;
        a total mounting height of the transponder corresponds essentially to a mounting height of the chip; and
        the coupling elements have a geometry and size so as to be configurable for use as a dipole antenna or for use as a plate capacitor in conjunction with an evaluation unit.

2. The transponder of claim 1 wherein the connection of the coupling elements with the contact pads is performed on a wafer.

3. The transponder of claim 1 wherein the coupling elements are formed in a meandrous way.

4. The transponder of claim 3 wherein the connection of the coupling elements with the contact pads is performed on a wafer.

5. The transponder of claim 1 wherein the dipole antenna has a working frequency of at least 2.45 GHz.

6. The transponder of claim 5 wherein the connection of the coupling elements with the contact pads is performed on a wafer.

7. The transponder of claim 5 wherein the coupling elements are formed in a meandrous way.

8. The transponder of claim 7 wherein the connection of the coupling elements with the contact pads is performed on a wafer.

9. The transponder of claim 1 wherein the dipole antenna has a working frequency of at least 24.125 GHz.

10. The transponder of claim 9 wherein the dipole antenna has a meandrous configuration.

11. A transponder comprising:

a chip having a contact pad; and a coupling element conductively connected with the contact pad, wherein:

the coupling element is formed in a self-supported as well as free-standing way and is essentially extended parallel to a plane of the chip;

a total mounting height of the transponder corresponds essentially to a mounting height of the chip; and the coupling element is configured in geometry and size as a plate capacitor for use in conjunction with an evaluation unit.

12. The transponder of claim 11 wherein the connection of the coupling element with the contact pad is performed on a wafer.

13. A transponder comprising:

a chip having at least two contact pads; and at least two coupling elements, each coupling element self-supporting and free-standing with respect to the other and each coupling element electrically connected to a respective contact pad on the chip, wherein the at least two coupling elements are configured as a dipole extending parallel to a plane of the chip and a mounting height of the transponder is approximately a mounting height of the chip.

14. The transponder of claim 13 wherein the at least two coupling elements are connected to the respective contact pad on a wafer level.

15. The transponder of claim 13 wherein the at least two coupling elements have a meandrous configuration.

16. The transponder of claim 13 wherein the dipole has a working frequency of at least 2.45 GHz.

17. The transponder of claim 13 wherein the dipole has a working frequency of at least 24.125 GHz.

18. The transponder of claim 13 wherein the at least two coupling elements:

are connected to the respective contact pad on a wafer level; and have a meandrous configuration.

19. The transponder of claim 18 wherein the dipole has a working frequency of at least 24.125 GHz.

20. The transponder of claim 18 wherein the dipole has a working frequency of at least 2.45 GHz.

* * * * *